(12) United States Patent
Cohen

(10) Patent No.: US 6,633,951 B2
(45) Date of Patent: Oct. 14, 2003

(54) METHOD FOR REDUCING POWER CONSUMPTION THROUGH DYNAMIC MEMORY STORAGE INVERSION

(75) Inventor: Ehud Cohen, Kiryat Motskin (IL)

(73) Assignee: Intel Corporation, Santa Clara, CA (US)

( * ) Notice: Subject to any disclaimer, the term of this patent is extended or adjusted under 35 U.S.C. 154(b) by 165 days.

(21) Appl. No.: 09/811,266

(22) Filed: Mar. 15, 2001

(65) Prior Publication Data

US 2003/0009617 A1 Jan. 9, 2003

(51) Int. Cl.⁷ .............................................. G06F 12/00
(52) U.S. Cl. ....................................... 711/105; 713/320
(58) Field of Search ................................ 711/105, 106; 713/320

(56) References Cited

U.S. PATENT DOCUMENTS

| 3,568,162 A | * | 3/1971 | Toy | 710/55 |
| 3,805,254 A | * | 4/1974 | Schuur | 365/189.01 |
| 4,106,105 A | * | 8/1978 | Pross, Jr. | 711/107 |
| 6,345,333 B1 | * | 2/2002 | Sassa et al. | 711/103 |

* cited by examiner

Primary Examiner—Hiep T. Nguyen
(74) Attorney, Agent, or Firm—Blakely, Sokoloff, Taylor & Zafman LLP

(57) ABSTRACT

A method and apparatus for reducing the power needed in a computing system to refresh dynamic random access memory. In one embodiment of the invention, data to be stored to DRAM is evaluated one word at a time. For each eight-bit data word, if the number of ones is more than four, each bit of the data word is inverted and a data inversion indicator (DII) bit is set to logic one, to indicate that the data has been inverted. This allows for the data to be stored accurately with the minimum number of ones present. Because of the power required to refresh ones stored in DRAM, storing a minimum number of ones will reduce power consumption. A read of the data will determine if the data had been inverted upon storage and if so will revert the data to its original form.

27 Claims, 4 Drawing Sheets

METHOD FOR REDUCING POWER CONSUMPTION THROUGH DYNAMIC MEMORY STORAGE INVERSION

FIELD OF THE INVENTION

This invention relates generally to mobile computing systems, and more specifically to a method for reducing power consumption of the same.

BACKGROUND OF THE INVENTION

The emphasis in mobile computing system (MCS) design is to reduce size and weight while increasing operating frequencies. One way in which MCSs have been reduced in size and weight is through a reduction in battery size. Today, MCSs may operate at frequencies of 850 MHz or more and these higher frequencies require more power. Therefore the emphasis on size reduction and increased performance has led to an emphasis on power conservation.

Most personal computers including MCSs use dynamic random access memory (DRAM) as main memory due to the DRAM's low cost per bit and low power consumption. A typical DRAM storage cell is shown in FIG. 1. The basic memory storage cell 100, shown in FIG. 1, is a capacitor, that is, an integrated capacitor 105 connected in series with a control transistor 110. The control transistor 110 acts as an on-off switch. To store data in, or read data from, the memory cell, the control transistor 110 is turned on, by applying a positive pulse to control line (word line) 115. When the control transistor 110 is turned off, the integrated capacitor 105 is isolated from the rest of the circuitry. The state of memory storage cell 100 is retained in the charge on integrated capacitor 105. When the integrated capacitor 105 is charged, a binary 1 is stored. When the integrated capacitor 105 is discharged, a binary 0 is stored. To read data from memory storage cell 100 the control transistor 110 is turned on connecting the integrated capacitor 105 to sense line (bit line) 120. External circuitry examines the state of integrated capacitor 105 and informs the central processing unit (CPU).

The capacitance in a memory storage cell is very small and therefore, any charge on it will quickly leak off. This would alter the state of the memory storage cell and the stored data would be lost. To avoid lost data, the charge on the cell is periodically refreshed. Typically the memory storage cell is refreshed approximately every two milliseconds. This refreshing process consumes power that, as a percentage of total power consumption, becomes significant in a MCS during some modes of operation.

BRIEF DESCRIPTION OF THE DRAWINGS

The present invention is illustrated by way of example and not intended to be limited by the figures of the accompanying drawings in which like references indicate similar elements and in which.

DETAILED DESCRIPTION

An embodiment of the present invention provides a method for reducing the power required to refresh dynamic memory. Data to be written to DRAM is evaluated one word at a time. If the number of ones is above a specified threshold, each bit of the word is inverted and a data inversion indicator (DII) bit is set to logic one, to indicate that the data has been inverted. This allows for the data to be stored accurately with the minimum number of ones present. The memory cells that store ones must be periodically refreshed as described above. This refreshing process uses power, so storing a minimum number of ones will reduce power consumption. A read of the data will determine if the data had been inverted upon storage and if so will revert the data to its original form.

Figure 1:
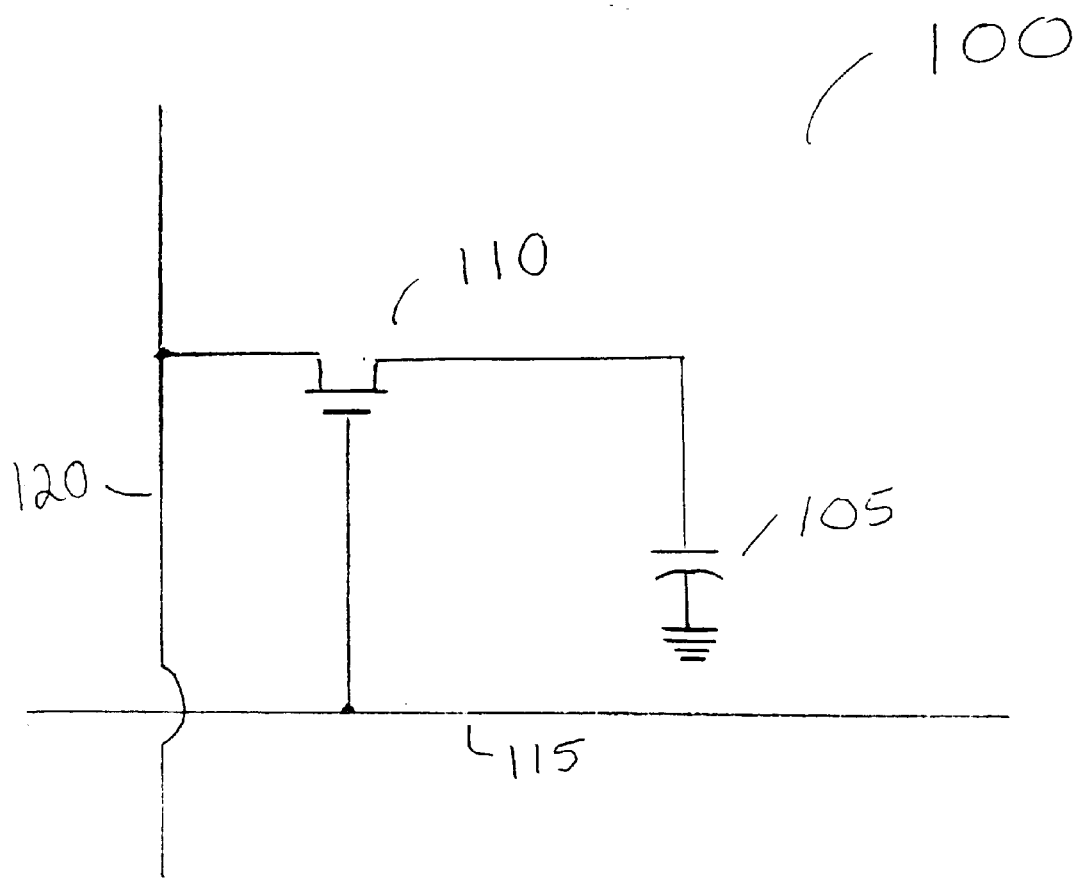
FIG. 1 depicts a typical DRAM storage cell according to the prior art.
Figure 2:
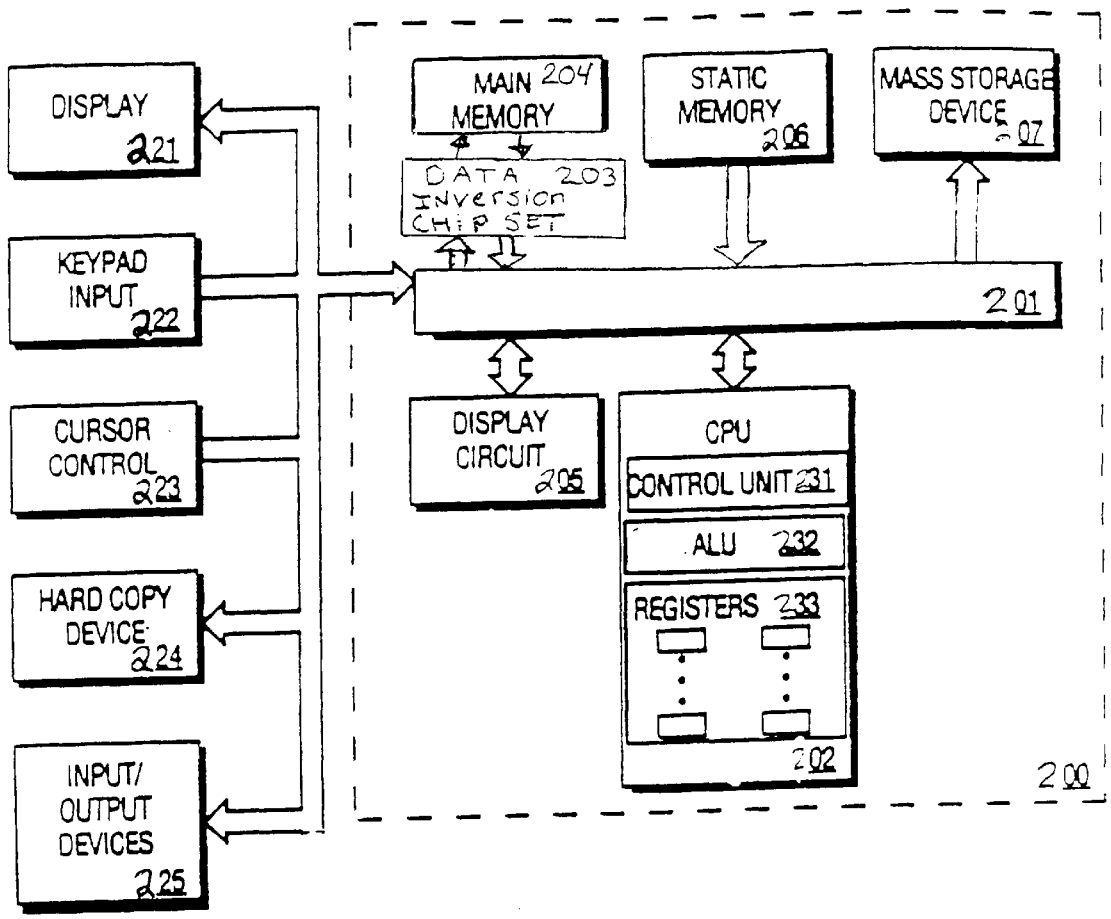
FIG. 2 is a diagram illustrating an exemplary computer system for implementing the present invention.

FIG. 2 is a diagram illustrating an exemplary computer system 200 for implementing the present invention. The determination to invert data prior to storage, the inversion of data, and the reversion of data, described herein, can be implemented and utilized within computing system 200. Computing system 200 can represent a general-purpose computer, portable computer, or other like device. The components of computing system 200 are exemplary in which one or more components can be omitted or added.

Referring to FIG. 2, computing system 200 includes a central processing unit 202 coupled to a display circuit 205, main memory 204, static memory 206, and mass storage device 207 via bus 201. In one embodiment, main memory 204 is coupled to the bus 201 through data inversion chipset 203. The data inversion chipset 203 interfaces to the main memory 204 and contains inversion circuitry as well as logic for counting the number of ones in a data word. In one embodiment a portion of the error correction code (ECC) chipset is modified to implement data inversion chipset 203.

Computing system 200 can also be coupled to a display 221, keypad input 222, cursor control 223, hard copy device 224, and input/output (I/O) devices 225 via bus 201.

Bus 201 is a standard system bus for communicating information and signals. CPU 202 is a processing unit for computing system 200. CPU 202 can be used to process information for computing system 200. CPU 202 includes a control unit 231, an arithmetic logic unit (ALU) 232, and several registers 233, which are used to process information.

Main memory 204 can be, e.g., a random access memory (RAM) or some other dynamic storage device, for storing information or instructions (program code), which are used by CPU 202. Main memory 204 may also store temporary variables or other intermediate information during execution of instructions by CPU 202. Static memory 206, can be, e.g., a read only memory (ROM) and/or other static storage devices, for storing information or instructions, which can also be used by CPU 202. Mass storage device 207 can be, e.g., a hard or floppy disk drive or optical disk drive, for storing information or instructions for computing system 200.

Display 221 can be, e.g., a cathode ray tube (CRT) or liquid crystal display (LCD). Display device 221 displays information or graphics to a user. Computing system 200 can interface with display 221 via display circuit 205. Keypad input 222 is an alphanumeric input device for communicating information and command selections to computing system 200. Cursor control 223 can be, e.g., a mouse, a trackball, or cursor direction keys, for controlling movement of an object on display 221. Hard copy device 224 can be, e.g., a laser printer, for printing information on paper, film, or some other like medium. A number of input/output devices 225 can be coupled to computing system 200.

The dynamic memory storage inversion process, described herein, can be implemented by hardware and/or software contained within computing system 200. For example, CPU 202 can execute code or instructions stored in a machine-readable medium, e.g., main memory 204, to decide when to transition the CPU performance level on a CPU that supports multiple performance levels.

The machine-readable medium may include a mechanism that provides (i.e., stores and/or transmits) information in a form readable by a machine such as computer. For example, a machine-readable medium may include a read only memory (ROM), random access memory (RAM), magnetic disk storage media, optical storage media, flash memory devices. The code or instructions can be represented by carrier wave signals, infrared signals, digital signals, and by other like signals.

Figure 3:
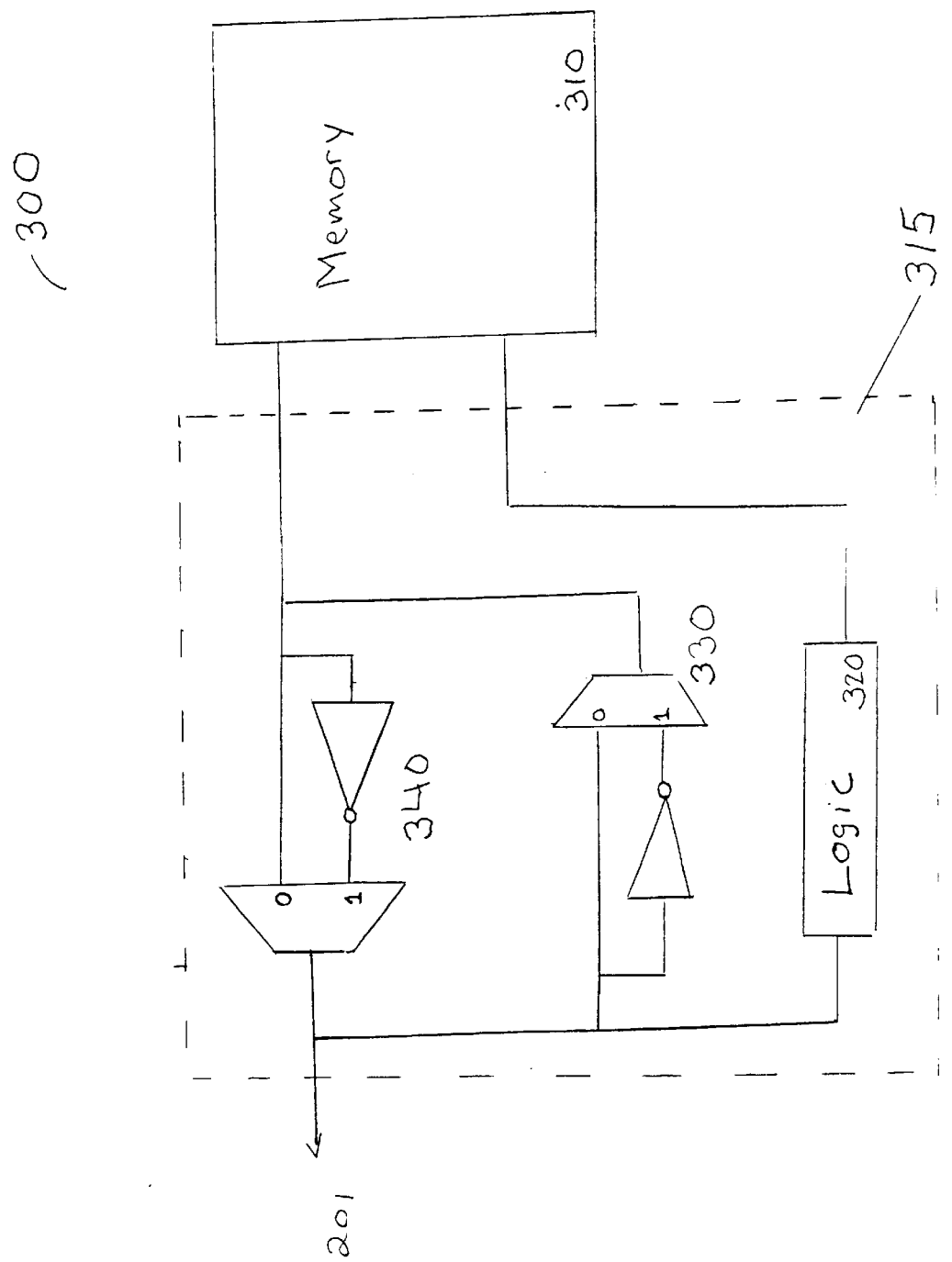
FIG. 3 illustrates a dynamic memory storage inversion system according to one embodiment of the present invention.

FIG. 3 illustrates a dynamic memory storage inversion system according to one embodiment of the present invention. The system 300 shown in FIG. 3 includes dynamic memory 310 interfaced with data inversion chipset 315. The chipset 315 includes logic 320, that may be, for example, a counter, that is used to determine if inversion of the data would result in storing less ones. The chipset 315 also includes a write inverter 330. During a write operation, data is received via the data bus 201; the data may be an eight-bit data word. The counter 320 counts the number of ones in the received data word. If the number of ones is above a specified threshold, for example, four for an eight-bit word, the data is inverted through write inverter 330. A DII bit is set to logic one, and the inverted data is stored to memory 310. The bit used to indicate data inversion may be the ECC bit. Most commercial DRAM includes an ECC bit that typically goes unused in all but high-end machines (e.g., servers). The ECC bit is not typically used in MCSs and so can be used as a DII bit. If the number of ones is not above the specified threshold, the data is simply stored to memory 310 without inversion and the DII bit is left at logic zero. If the processing overhead is high, the threshold can be set higher (e.g., 6 ones per eight-bit word) to produce a power saving.

The chipset 315 also includes a read inverter 340. During a read operation the DII bit of the word being read is checked. If the DII is set to logic one, indicating that the data word had been inverted when stored to memory, the data is inverted prior to being put out on bus 201.

The dynamic memory storage inversion method of the present invention reduces power consumption by reducing the power required to refresh capacitive memory. This is especially true for modes in which the DRAM is not operated (e.g. "sleep mode"). While a MCS is in sleep mode the DRAM external clock is disabled. In this mode, a suspend to RAM mode, a large percentage of operational power requirements is used to refresh the capacitive dynamic memory cells. This means that the present invention significantly extends the time for which a limited DC source can maintain a MCS while in sleep mode. Power is also saved in normal operation mode or when the DRAM is in a standby mode.

Figure 4:
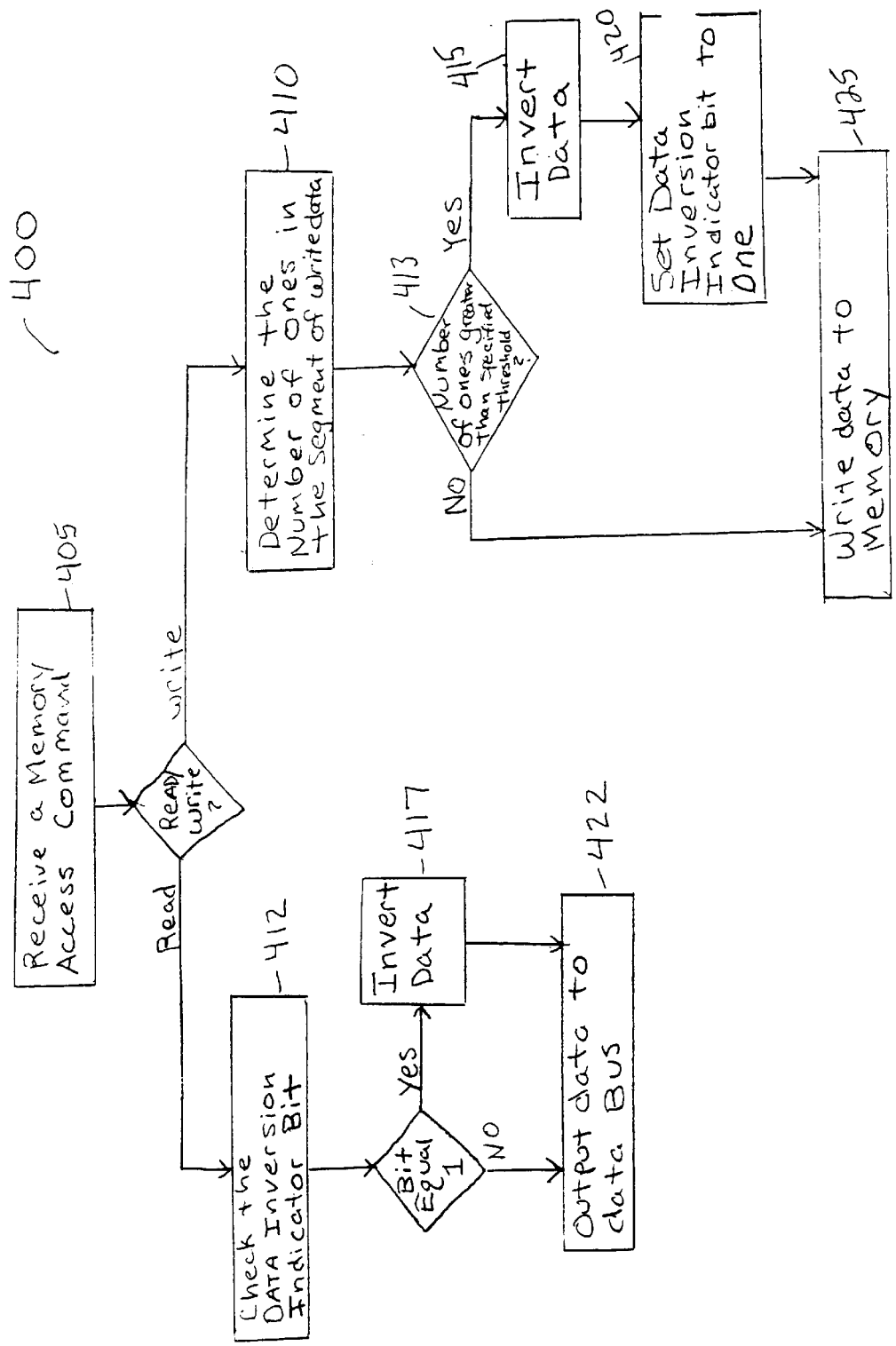
FIG. 4 is a process flow diagram according to one embodiment of the present invention.

FIG. 4 is a process flow diagram according to one embodiment of the present invention. The process 400, shown in FIG. 4 begins at operation 405 in which a memory access command is received. For a write operation the process continues at operation 410 in which the number of ones in the write data segment is determined. This number is compared to a specified threshold at operation 413. The threshold may be, for example, 50%. If the number of ones is greater than the specified threshold, the data is inverted at operation 415. At operation 420 the DII bit of the write data is set to one to indicate that the data has been inverted. The inverted form of the data is then stored to memory at operation 425. At operation 413, if the number of ones does not exceed a specified threshold, the data is stored to memory as is, at operation 425.

For a read operation the process continues from operation 405 at operation 412 in which the DII bit is checked. If the bit equals one this indicates that the data had been inverted prior to being stored to memory. If so, the stored data is inverted again at operation 417 to obtain the actual data. The data is then output at operation 422. If, at operation 412 the DII bit is checked and found to be zero then the data is simply output at operation 422.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method comprising:
   receiving a binary data segment, the binary data segment to be stored to memory;
   determining the number of ones contained in the binary data segment;
   determining a specified threshold number of ones such that inverting the ones will result in a power savings;
   inverting the binary data segment if the number of ones is above the specified threshold; and
   storing the binary data segment to the memory such that an inverted binary data segment is indicated by an inversion indicator.

2. The method of claim 1, wherein the memory is dynamic random access memory.

3. The method of claim 1, wherein the specified threshold is more than fifty percent of the bits contained in the binary data segment.

4. The method of claim 1, wherein the binary data segment is an eight-bit word.

5. The method of claim 4, wherein the specified threshold is five.

6. The method of claim 1, wherein the inversion indicator is an inversion indicator bit.

7. The method of claim 1, wherein the determining the number of ones contained in the binary data segment is accomplished by counting logic, the counting logic interfaced to the memory.

8. The method of claim 1, wherein the inverting the binary data segment is accomplished by inverting logic, the inverting logic interfaced to the memory.

9. The method of claim 1, further comprising:
   reading a binary data segment from memory; and
   inverting the binary data segment prior to output if the inversion indicator indicates that the binary data segment was inverted prior to being stored to the memory.

10. A machine-readable medium that provides executable instructions, which when executed by a processor, cause the processor to perform a method, the method comprising:
    receiving a binary data segment, the binary data segment to be stored to memory;
    determining the number of ones contained in the binary data segment;
    determining a specified threshold number of ones such that inverting the ones will result in a power savings;

inverting the binary data segment if the number of ones is above the specified threshold; and storing the binary data segment to the memory such that an inverted binary data segment is indicated by an inversion indicator.

11. The machine-readable medium of claim 10, wherein the memory is dynamic random access memory.

12. The machine-readable medium of claim 10, wherein the specified threshold is more than fifty percent of the bits contained in the binary data segment.

13. The machine-readable medium of claim 10, wherein the binary data segment is an eight-bit word.

14. The machine-readable medium of claim 13, wherein the specified threshold is five.

15. The machine-readable medium of claim 10, wherein the inversion indicator is an inversion indicator bit.

16. The machine-readable medium of claim 10, wherein the determining the number of ones contained in the binary data segment is accomplished by counting logic, the counting logic interfaced to the memory.

17. The machine-readable medium of claim 10, wherein the inverting the binary data segment is accomplished by inverting logic, the inverting logic interfaced to the memory.

18. The machine-readable medium of claim 10, further comprising:

reading a binary data segment from memory; and inverting the binary data segment prior to output if the inversion indicator indicates that the binary data segment was inverted prior to being stored to the memory.

19. An apparatus comprising:

a receiving unit to receive a binary data segment, the binary data segment to be stored to memory;

a counting unit to determine the number of ones contained in the binary data segment;

an inverting unit to invert the binary data segment if the number of ones is above a specified threshold, the specified threshold indicating a number of ones such that inverting the ones will result in a power savings; and a memory unit to store the binary data segment such that an inverted binary data segment is indicated by an inversion indicator.

20. The apparatus of claim 19, wherein the memory is dynamic random access memory.

21. The apparatus of claim 19, wherein the specified threshold is more than fifty percent of the bits contained in the binary data segment.

22. The apparatus of claim 19, wherein the binary data segment is an eight-bit word.

23. The apparatus of claim 22, wherein the specified threshold is five.

24. The apparatus of claim 19, wherein the inversion indicator is an inversion indicator bit.

25. The apparatus of claim 19, wherein the counting unit is counting logic, the counting logic interfaced to the memory.

26. The apparatus of claim 19, wherein the inverting unit is inverting logic, the inverting logic interfaced to the memory.

27. The apparatus of claim 19, further comprising:

reading a binary data segment from memory; and inverting the binary data segment prior to output if the inversion indicator indicates that the binary data segment was inverted prior to being stored to the memory.

* * * * *